United States Patent [19]

Doty, Jr.

[11] 4,255,728

[45] Mar. 10, 1981

[54] PARALLEL RESONANT ELECTRIC CIRCUIT

[76] Inventor: Archibald C. Doty, Jr., 8360 Rushton Rd., South Lyon, Mich. 48178

[21] Appl. No.: 936,389

[22] Filed: Aug. 24, 1978

[51] Int. Cl.³ .......................... H03H 5/00; H03J 3/10; H03J 3/20; H03J 3/22

[52] U.S. Cl. ..................... 333/219; 333/185; 333/202; 336/129

[58] Field of Search .......... 333/175, 219–221, 333/235, 185; 336/69, 115, 118, 121, 123, 129; 334/71, 75

[56] References Cited

U.S. PATENT DOCUMENTS

| | | | |
|---|---|---|---|
| 2,173,084 | 9/1939 | Case | 336/129 |
| 3,465,267 | 9/1969 | Carlson, Jr. | 333/175 |
| 3,560,895 | 2/1971 | Matsumoto | 333/175 |

FOREIGN PATENT DOCUMENTS 720587  2/1932  France ..................... 334/71

Primary Examiner—Marvin L. Nussbaum
Attorney, Agent, or Firm—Whittemore, Hulbert & Belknap

[57] ABSTRACT

A parallel resonant electric circuit comprising a first and second concentric electrical coil wound in the same directions with the convolutions of the one coil between the convolutions of the other coil and with one end of one coil connected to the opposite end of the other coil, and a third electrical coil extending within the first and second coil if it is desired to tune the parallel resonant circuit.

2 Claims, 3 Drawing Figures

PARALLEL RESONANT ELECTRIC CIRCUIT

BACKGROUND OF THE INVENTION

1. Field of the Invention

The invention relates to electric circuits and refers more specifically to a parallel resonant or rejector circuit for use in antenna matching, filter design and the like, wherein the parallel resonant circuit is responsive to a particular electrical frequency.

2. Description of the Prior Art

In the past, parallel resonant circuits have generally included a capacitor and inductor connected in parallel which provide matched capacitive and inductive reactance to produce resonance of the circuit at a predetermined electrical frequency. Such circuits have sometimes been called resonant tank circuits.

In the usual parallel resonant circuit it is necessary to separately produce an electrical coil and capacitor. The separately produced coil and capacitor are then connected together as by soldering to form the parallel resonant circuit. The separate production of the different members, that is, the coil and capacitor and their subsequent connection into a parallel resonant tank circuit, makes the prior known parallel resonant circuits more complex and more expensive than desirable.

SUMMARY OF THE INVENTION

In accordance with the invention, a parallel resonant electric circuit is provided constructed entirely of coils. The parallel resonant circuit of the invention does not use any capacitors.

In accordance with the invention, a first and second electrical coil are produced. One end of the second coil is connected to the opposite end of the first coil. The coils thus wound and connected are positioned to interact with each other to produce required capacitance and inductance for parallel resonance at a predetermined frequency.

A third coil may be introduced into the parallel resonant circuit of the invention to provide tuning of the parallel resonant circuit. The third coil, when utilized, may be positioned to interact electrically with the first two coils to vary the frequency at which the parallel resonant circuit of the invention is resonant.

DESCRIPTION OF THE PREFERRED EMBODIMENT

Figure 1:
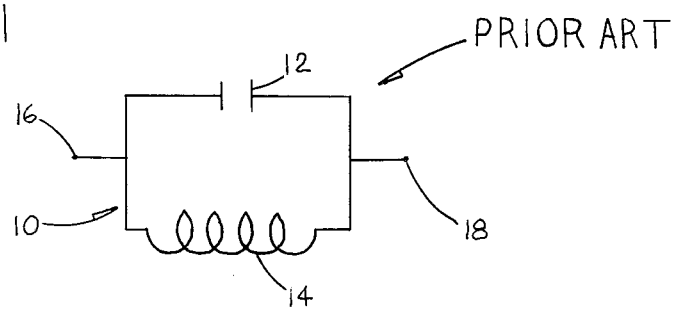
FIG. 1 is a schematic diagram of a parallel resonant circuit of the prior art.

In the past, parallel resonant circuits 10, as shown in FIG. 1, have included a separate capacitor 12 and electrical coil 14 connected together in parallel, as shown, for connection in other electrical circuits at points 16 and 18.

Parallel electrical circuits 10 may be resonant at a predetermined frequency determined by the inductive reactance of the coil 14 and the capacitive reactance of the capacitor 12. Further, the frequency at which a parallel resonant circuit 10 is resonant may be varied by making either the capacitor 12 or the coil 14 variable.

Parallel resonant circuits such as circuit 10 are, however, more complicated and therefore more expensive than necessary. Thus, with such circuits the capacitor 12 and the coil 14 are separately produced and then mechanically connected together. Often the manufacture of each component and the assembly of the circuit 10 are accomplished at different locations with shipping and material handling occurring between or during each of the manufacture of the capacitor and coil and the securing of the capacitor and coil together in the finished parallel circuit.

Figure 2:
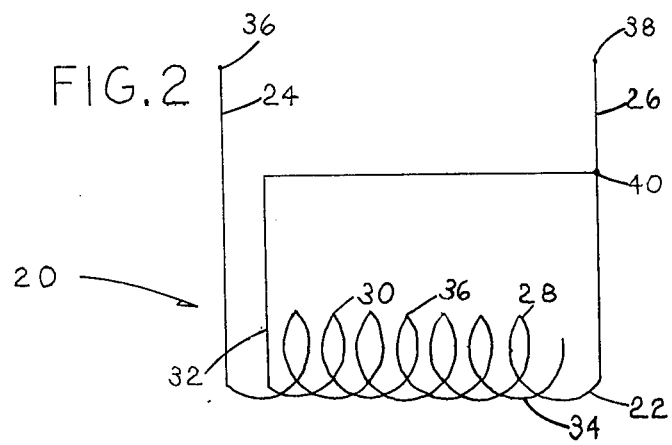
FIG. 2 is a schematic diagram of the parallel resonant circuit of the invention.

The parallel resonant circuit of the invention 20, as shown best in FIG. 2, includes a first coil 22 having opposite ends 24 and 26 and a plurality of separate convolutions 28. The parallel resonant circuit 20 further includes a second electrical coil 30 also having opposite ends 32 and 34 and a plurality of convolutions 36.

As shown best in FIG. 2, the separate convolutions 36 of the coil 30 are placed between and are separated by the separate convolutions 28 of the coil 22. The coils 22 and 30 are concentric in the embodiment of the invention illustrated in FIG. 2.

The one end 32 of the coil 30 is connected to the other end 26 of the coil 22, as shown best in FIG. 2. The coils 22 and 30 are wound in the same direction. The parallel resonant circuit 20 is adapted to be connected into an external circuit at the points 36 and 38.

With the parallel resonant circuit 20 constructed as shown, the required capacitive reactance is provided between the coils 22 and 30 without objectionable mutual inductance between the coils due to the construction of the parallel resonant circuit 20, as set forth above. Further, the parallel resonant circuit of FIG. 2 includes no separate capacitor and may thus be produced and assembled at a single facility with less expense and mechanical complexity than the parallel resonant circuit 10 of the prior art as shown in FIG. 1.

Figure 3:
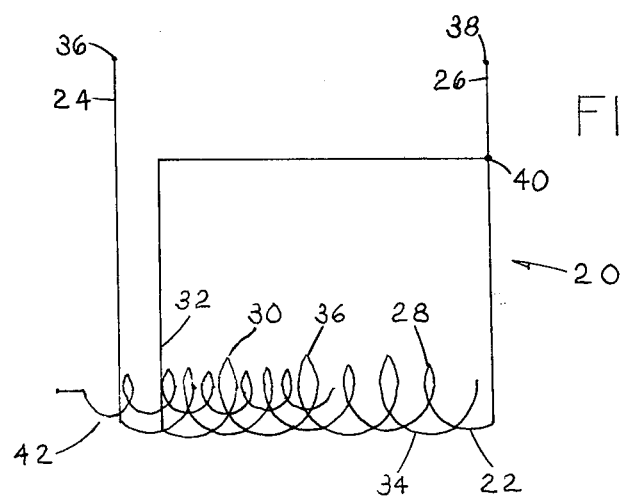
FIG. 3 is a schematic diagram of the parallel resonant circuit of the present invention including a tuning coil operably associated therewith.

As shown best in FIG. 3, the parallel resonant circuit 20 of the invention may be tuned by inserting a tuning coil 42 into the coils 22 and 30. The axial position of the tuning coil 42 within the coils 22 and 30 will vary the resonant frequency of the parallel resonant circuit 20 in accordance with the variation in the inductive and capacitance reactance of the circuit 20 caused by the insertion of the tuning coil 42 into the coils 22 and 30. It has been found that a tuning of approximately 10% of the resonant frequency of the parallel resonant circuit 20 may be accomplished by the use of tuning coil 42 in various axial positions within the tuning coil 42.

In a specific embodiment of the invention as shown in FIGS. 2 and 3, the coil 22 is constructed of 33 turns of No. 22 gauge enamelled copper wire and was 1-$\frac{3}{4}$" long and $\frac{1}{4}$" in outside diameter, while coil 30 is constructed of 8 turns of No. 22 gauge enamelled copper wire and was $\frac{1}{2}$" long and $\frac{1}{4}$" in outside diameter. The end 32 of coil 30 is soldered to the end 26 of coil 22 at point 40. The resultant parallel resonant circuit between points 36 and 38 was resonant at 30.4 megahertz.

On insertion of a tuning coil 42 coaxially into the resonant filter 20, the frequency variation obtained by the tuning coil 42 was approximately 3.0 megahertz; that is to say, the frequency was varied between 27.4 and 30.4 megahertz.

The tuning coil 42 was constructed of a plurality of turns of No. 22 gauge enamelled copper wire and was 1-$\frac{1}{8}$" in length and $\frac{1}{8}$" in outside diameter. The tuning coil 42 was inserted into the coils 22 and 30 coaxially therewith.

While one embodiment and a modification of the present invention have been considered in detail, it will be understood that other embodiments and modifications thereof are contemplated by the inventor. Thus, for example, the coils may be related in other than the manner indicated in FIG. 2 to provide the appropriate inductive and capacitive reactance to produce resonance of the parallel resonant circuit at predetermined frequencies. Thus, the coils 22 and 30 may be of different diameter and/or of different length and positioned differently both radially and axially. Further, the tuning coil 42 may be replaced by a powdered metal or other tuning core. Thus, in one modification of the invention, using coils made and constructed as set forth in the embodiment specified above but wound with No. 34 copper wire on a 3/16" diameter ceramic core, the following resonant frequencies resulted from varying the number of turns in coil 30 while holding the number of turns in coil 22 the same.

| No. of Turns | | Resonant Frequency |
|---|---|---|
| Coil 22 | Coil 30 | |
| 30 | 27 | 12.6 MHz |
| 30 | 25 | 13.1 MHz |
| 30 | 20 | 14.5 MHz |
| 30 | 15 | 17.1 MHz |
| 30 | 10 | 22.2 MHz |
| 30 | 5 | 33.9 MHz |
| 30 | 4 | 38.7 MHz |
| 30 | 3 | 47.0 MHz |

-continued

| No. of Turns | | Resonant Frequency |
|---|---|---|
| Coil 22 | Coil 30 | |
| 30 | 2 | 59.2 MHz |
| 30 | 1 | 126 MHz |

It is the intention to include all embodiments and modifications of the invention as are defined by the appended claims within the scope of the invention.

What I claim is:

1. A parallel resonant circuit having only coils and being resonant at a predetermined frequency comprising a first coil having a plurality of convolutions and opposite ends, a second electrical coil extending concentrically with the first electrical coil and having a plurality of convolutions and opposite ends, the convolutions of the second coil separating the convolutions of the first coil and one end of the second coil being connected to the opposite end of the first coil and a third coil having a plurality of convolutions inserted within the first and second coils for axial movement therein to tune the resonant frequency of the parallel resonant electric circuit.

2. A parallel resonant circuit having only coils and being resonant at a predetermined frequency comprising a first coil having a plurality of convolutions and opposite ends, a second electrical coil extending concentrically with the first electrical coil and having a plurality of convolutions and opposite ends, one end of the second coil being connected to the opposite end of the first coil, and a third coil having a plurality of convolutions inserted within the first and second coils for axial movement therein to tune the resonant frequency of the parallel resonant electric circuit.

* * * * *